United States Patent [19]
Clemens et al.

[11] Patent Number: 5,917,700
[45] Date of Patent: Jun. 29, 1999

[54] HEAT SINK AND ATTACHMENT PROCESS FOR ELECTRONIC COMPONENTS

[75] Inventors: Donald L. Clemens, The Colony, Tex.; Theophilus Ifeanyi Ejim, Ringoes; Kon Mang Lin, Pennington, both of N.J.; Ralph E. Stenerson, Newtown, Pa.

[73] Assignees: Lucent Technologies Inc, Murray Hill, N.J.; Thermalloy Inc., Dallas, Tex.

[21] Appl. No.: 08/932,815

[22] Filed: Sep. 16, 1997

[51] Int. Cl.$^6$ ............................................. H05K 7/20
[52] U.S. Cl. ..................... 361/704; 361/704; 361/697; 165/80.3; 165/80.4; 257/727; 174/16.3; 439/64; 439/70
[58] Field of Search ................ 361/695, 697–712, 361/720–728; 165/80.3, 80.4; 174/16.3; 439/367, 325, 64, 68, 70, 81; 248/505; 24/625, 296; 257/718, 719, 709, 712

[56] References Cited

U.S. PATENT DOCUMENTS

| 5,371,652 | 12/1994 | Clemens et al. | 361/704 |
| 5,448,449 | 9/1995 | Bright et al. | 361/704 |
| 5,594,624 | 1/1997 | Clemens et al. | 361/704 |

*Primary Examiner*—Leo P. Picard
*Assistant Examiner*—Michael Datskovsky

[57] ABSTRACT

A clip assembly and method of attachment for a heat sink having a pin-fin array employing thermally conducting tape to secure the heat sink to a heat dissipating BGA component together with at least one clip assembly which is secured to the underside of the component at its edges.

19 Claims, 5 Drawing Sheets

HEAT SINK AND ATTACHMENT PROCESS FOR ELECTRONIC COMPONENTS

BACKGROUND OF THE INVENTION

1. Field of the Invention

This invention relates to the removal of heat from electronic components, and in particular to the attachment of a heat sink to a component having a ball grid array (BGA) serving as contacts.

2. Description of Related Art

The efficient removal of heat from operating electronic components is a widespread problem which is addressed by various methods of convection and conduction heat transfer. Thermal performance is also enhanced by using components with integral heat spreaders where the die is attached directly to one side of a heat spreader whose other side is the upper exterior of the component. This can improve heat dissipation by a factor of two, but an additional heat sink is needed where the power dissipation exceeds four watts.

Other factors to consider are the supporting printed wiring board's layout, mounting technology, space availability, and the intended life time of the product. The wiring layout can be complicated where holes need to be drilled through the printed wiring board to mount components or heat sinks. Surface mount technology has been developed to avoid holes, save space, and to simplify and automate assembly by using a reflow soldering process which is well known. The inputs/outputs (I/Os) of the component terminate in solder balls on the underside of the BGA component. Their number can exceed 500 per component, and they are arranged in a ball grid array. The attachment of any heat sink for greater thermal performance must be compatible with surface mount technology.

The reliability and lifetime of semiconductor junctions are inversely related to the junction temperature. Service lifetimes of less than a decade have been acceptable for consumer electronics because upgrades in software have caused obsolescence in relatively inexpensive apparatus. For industrial applications such as the telecommunications industry, however, the large capital expense associated with the introduction of a new system requires a minimum lifetime of 20 years. The increased complexity of these systems, therefore the number of dissipating junctions per chip, also requires the dissipation of heat in excess of four watts per component.

Accordingly, there is a need in the art for a heat sink and attachment process that is compatible with ball grid array components assembled with surface mount technology which also meets the performance and reliability requirements of the telecommunications industry.

SUMMARY OF THE INVENTION

The present invention relates to a clip assembly adapted to secure a heat sink to a heat producing component which is attached to a printed wiring board using surface mount technology. An array of solder balls on the underside of the BGA component interconnect a semiconductor chip inside the component to leads on the printed wiring board. To ensure a service life of at least 20 years, a clip assembly engages the underside of the component at two opposite edges and applies a force against a heat sink to bias it against the upper surface of the component. A thermally conducting adhesive layer is interspersed between the heat sink and the upper surface of the component.

The clip assembly is comprised of two ends which are insulators and which are adapted to grip the underside of the component without damaging the solder ball connections. It is also comprised of a spring which is adapted to apply a force against the heat sink and to engage arbors on each end to secure the spring to the ends.

The heat sink and clip assembly are applied by cleaning the upper surface of the component to remove organic contamination, preparing a thermally conducting adhesive layer on the underside of the heat sink, pressing the heat sink onto the component, aligning the spring between fins of the heat sink, and securing fingers protruding from each end beneath the component.

The advantages of this configuration are its compatibility with surface mount technology because no through holes are needed in the printed wiring board and the assurance that the heat sink will remain in thermal contact with the component for a 20 year period.

These and other features and advantages of the invention will be better understood with consideration of the following detailed description of the preferred embodiments taken in conjunction with the accompanying drawings.

The drawings are not to scale.

DETAILED DESCRIPTION OF THE PREFERRED EMBODIMENTS

Figure 1:
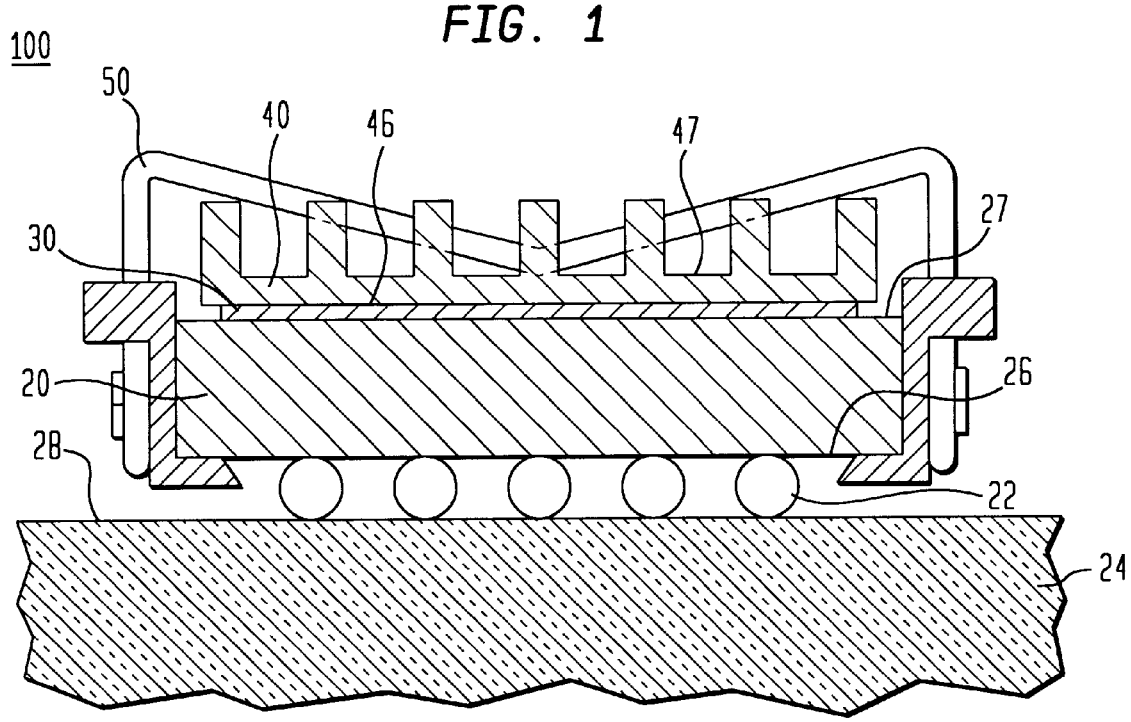
FIG. 1, is a sectional view of one embodiment of the invention.

Referring now to FIG. 1, there is shown apparatus 100, in accordance with one embodiment of the invention, which is a heat sink assembly which partially surrounds a heat producing component 20 which may contain a semiconductor chip having junctions which perform memory or processing functions or which emit light. The component could also contain a electrical resistance which generates heat. The component is fabricated with inputs and outputs (I/Os) which are in the form of solder balls 22. As the number of functions performed by the component have increased, component technology has increased the number of (I/Os) and the technology has evolved to the arrangement of these solder balls into arrays which may exceed 500 on the bottom surface of the component. The solder balls are typically 25 mils in diameter, and they are attached to leads (not shown) supported by printed wiring board 24 in a reflow soldering process which is well known. The stand-off clearance between the bottom surface 26 of the component and the top surface 28 of the printed wiring board typically ranges from approximately 20 to 30 mills depending on the process and the amount of solder paste applied to the printed wiring board.

Heat sink assembly 100 is comprised of thermally conducting layer 30, heat sink 40, and clip assembly 50. The thermally conducting layer provides for intimate contact between the top surface 27 of the component and a bottom surface 46 of the heat sink by being compliant enough to absorb surface irregularities and provide full area contact. The thermally conducting layer could be applied as a one-part or a two-part adhesive system which is well known and it may be either in fluid or solid form. The layer could also be in the form of a double-sided tape, applied separately during assembly or furnished already attached on one side to either the component or the heat sink. The tape provides for quick assembly of the heat sink to the component and it ensures thermal contact between their adjoining surfaces because it is compliant enough to absorb surface irregularities on these surfaces. The heat sink is a pin-fin array which is commercially available in a variety of pin sizes and configurations. Heat sinks have been mounted to components with tape alone in consumer electronic applications which are relatively low in cost, have moderate duty cycles, and have an expected life of less than a decade because of obsolescence. The personal computer is an example. Industrial telecommunications applications, however, require high reliability over 20 year life with a continuous duty cycle. Exposing the tape to temperatures of about 100 degrees C. for this long an interval will degrade the tape and increase the thermal resistance between the component and the tape. This, in turn, causes higher semiconductor junction temperatures and increased failure rates which are unacceptable in industrial applications. To ensure reliable operation over a 20 year life, clip assembly 50 is attached around the sides of the component and is configured to press the heat sink onto the component.

Figure 2A:
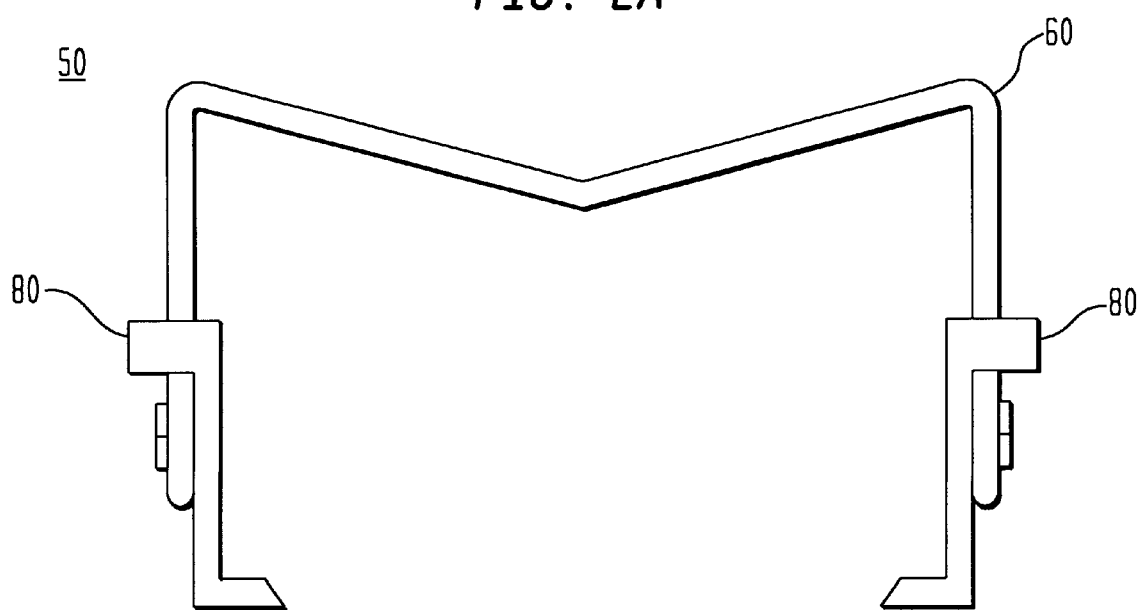
FIG. 2A, FIG. 2B and FIG. 2C are views of an assembly of the invention.
Figure 2B:
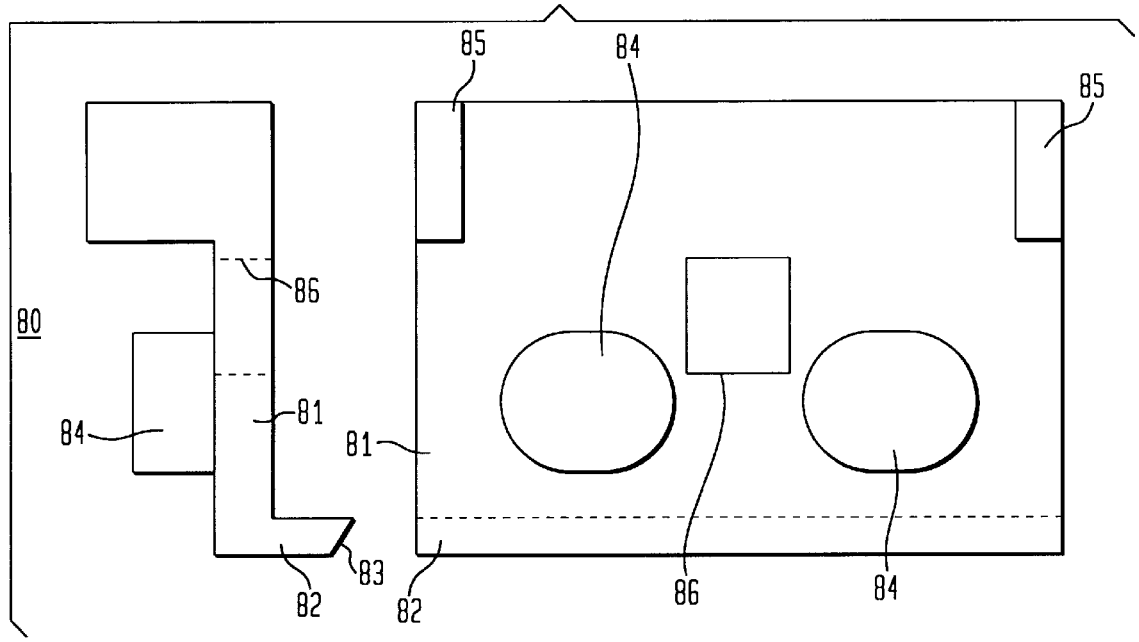
Figure 2C:
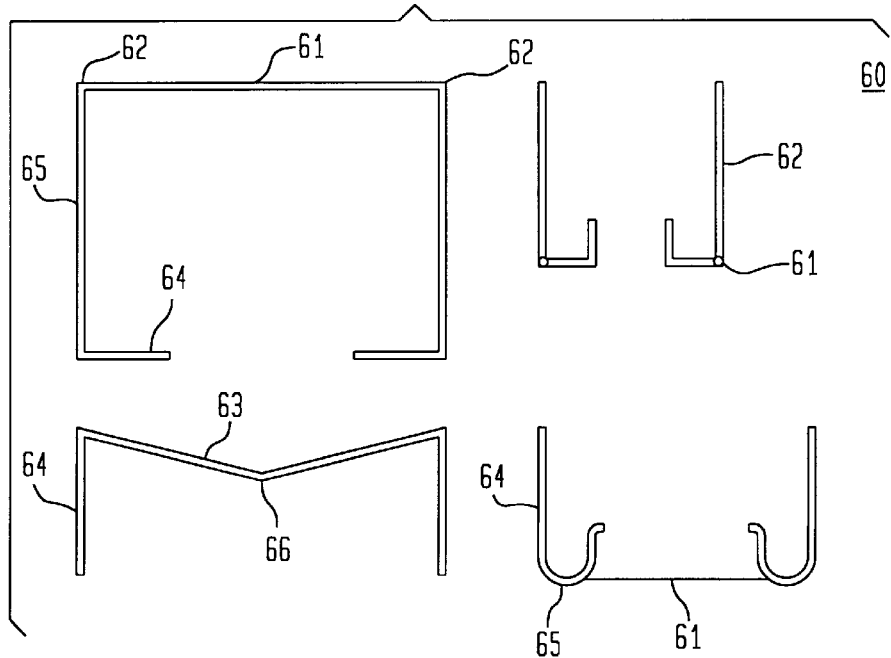

Referring now to FIG. 2A, there is shown clip assembly 50 which is comprised of spring 60 and two ends 80 which are arranged so that they adapted to grip component 20 at its sides and beneath bottom surface 26. The ends are shown in greater detail in FIG. 2B, each end being comprised of a body 81 which supports edge 82 having a chamfer 83 on its distal end. The body also supports arbors 84 and posts 85 which are adapted to restrain spring 60. The body also defines aperture 86 which provides access for tools which aid in the mounting and removal of the clip assembly. The configuration of the spring is shown in greater detail in FIG. 2C. The spring is fabricated from a single piece of music wire and it is bent around arbors 84 and restrained by posts 85 to form clip assembly 50.

Figure 3:
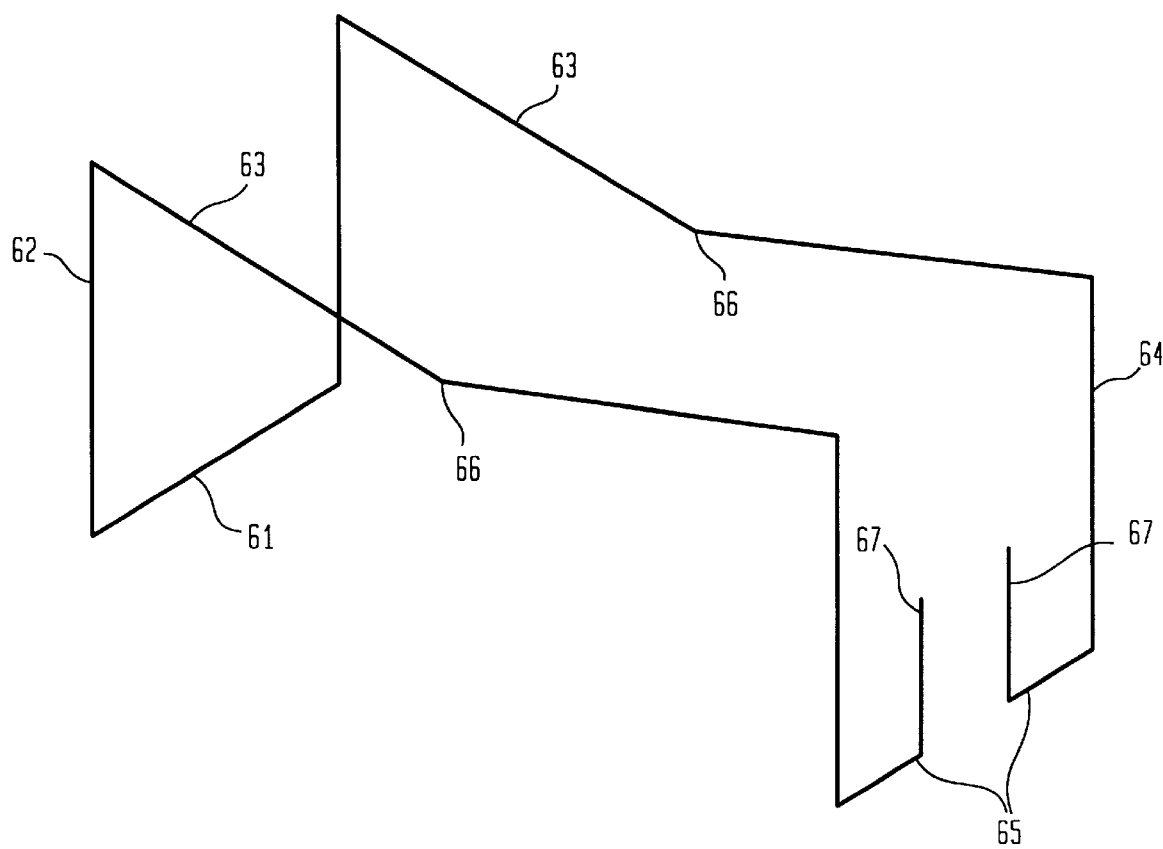
FIG. 3 is a perspective view of an element of the invention.

Referring now to FIG. 3, there are shown an isometric view of the spring. The spring is comprised of several sections beginning with a spring comprising, a distal section 61 having two ends which are attached to two riser sections 62, each having two ends and parallel to each other, the first end of each being connected to the ends of the distal section to form a first plane, the second ends of the riser sections are attached to two bent sections 63, each having two ends and a nadir 66, to form second planes normal to the first plane. Next there are two descending sections 64 parallel to each other, each having two ends, the first end of each being connected to the second end of each bent section to lie in the second plane. The first ends of two proximal sections 65 are connected to the second ends of the descending sections, the proximal sections being in a plane parallel to the first plane. The second ends of the proximal sections are connected to the first ends of two second riser sections 67. They are also in a plane parallel to the first plane. The nadir of the spring is adapted to exert a force against the heat sink biasing it against the electronic component.

In a preferred embodiment, the heat sink is black anodized aluminum supplied by Thermalloy Inc., of Dallas, Tex. as part No. 18087 which has overall dimensions of 1.700× 1.625×0.650 inches. The pin-fins are rectangular, with a cross section of 50×65 mils, and they are arranged in a rectangular array with 100 mil and 65 mils spaces between them, respectively. The pin-fins are 450 mils high and reside on a base of 200 mils. Spring 60 is made from 41 mil music wire and is adapted to fit between the pin-fins to apply a force against the heat sink. The ends are also supplied by Thermalloy and are molded using Ultem 1000, a compound supplied by G E Plastics. Edge 82 is typically 15 mils thick so as to fit within the stand-off clearance between the component and the printed wiring board, and it extends 23 mils under the edge of the component. Chamfer 83 is approximately 45 degrees from vertical. It is important to limit the length of the edge so that it does not reach the solder ball nearest the edge of the component. The dimension of the clip assembly and the heat sink may be changed to fit a particular component. Tape 30 is 9 mils thick and sold under the tradename "Thermattach 412" by Thermaloy, Inc. The heat sink can be obtained from the vendor with the tape and a protective, peel-away liner attached to it's lower surface.

Test results using the preferred embodiment have shown that 6 watts can be dissipated and that junction temperatures can be kept below 125 degrees C. in a 70 degree C. ambient using a component that has a heat spreader plate on its upper surface. This component configuration has an internal thermal resistance of 0.5 degree C./watt and another 0.5 degree C./watt is added by the tape layer. Test boards with and without heatsinks were cycled from zero to 100 degrees C. at a rate of 20 degrees C./minute and a dwell time of 5 minutes at each temperature. This was to test for possible failure modes in solder joint integrity caused by the heat sink attachment process and the extra weight and bending moments applied to the solder joints by the heat sink and the clip assembly. There were different degrees of degradation in the solder joint attachment reliability ranging from no effect to severe degradation.

Figure 4:
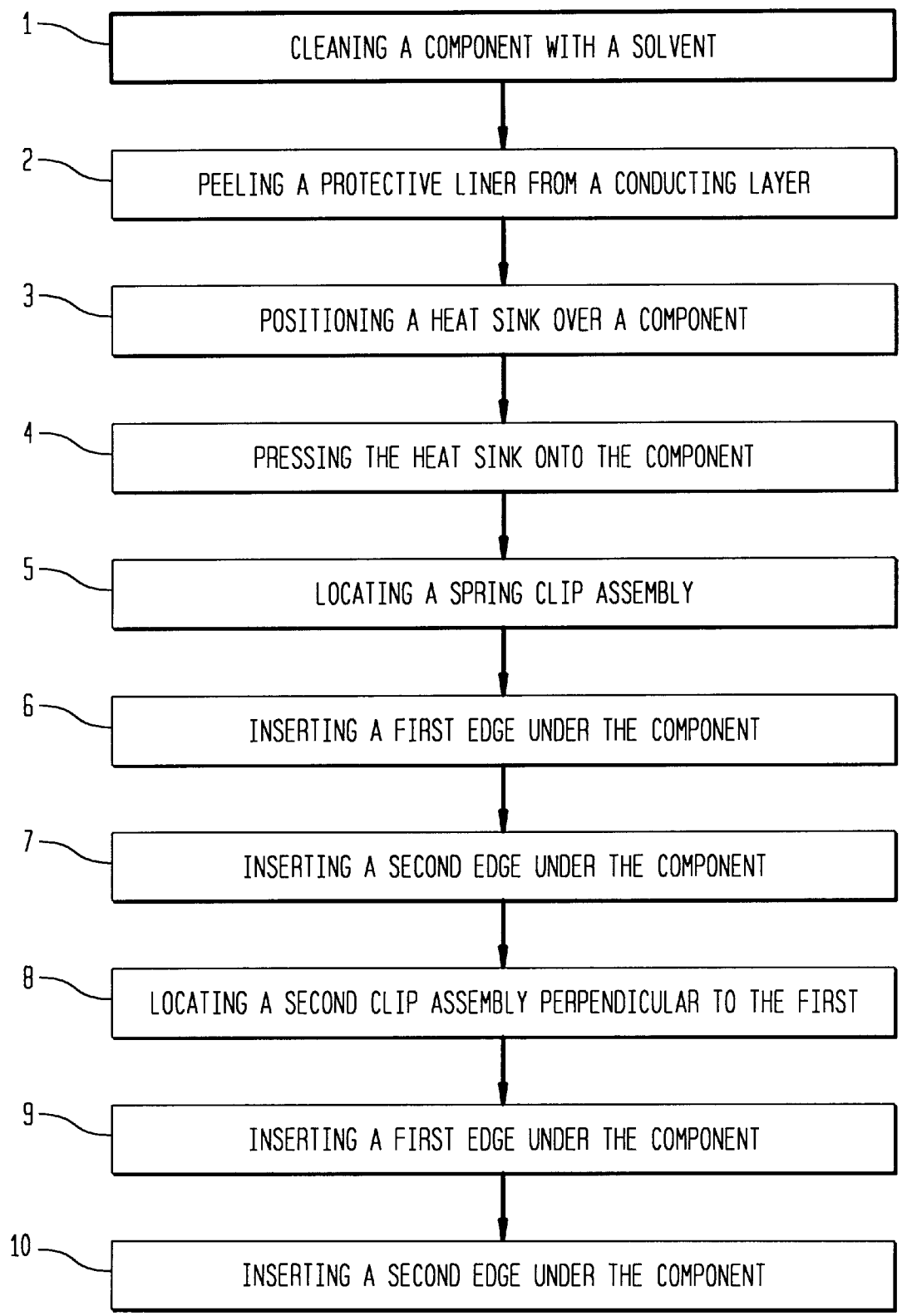
FIGS. 4 and 5 show the steps in practing the invention.

Referring now to FIG. 4, there is shown a method to attach the heat sink to heat generating components the printed wiring board which supports them is placed so that the upper surfaces of the component face upwards. The upper surfaces are then wiped with a lint free cloth containing a solvent, such as, but not limited to, isopropyl alcohol. (Step 1 in FIG. 4). This is to remove any organic contamination such as fingerprints which may have accumulated on the component surface. The surface should be clean so that the adhesive tape will adhere to the entirety of the surface to enhance heat transfer and long component life. Assemblers should wear protective gloves to prevent further contamination after this step. The heat sink is usually supplied with a thermally conductive tape layer attached to the underside of the heat sink and the tape is protected with a removable liner. At assembly, the liner is peeled away to expose the clean tape layer and the heat sink is positioned over the component with the tape facing the component (Step 2). Adhesion between the tape and the component can be improved by heating the component with hot air or infra-red lamps (65 degrees C. for 5 seconds at the bonding surface). The heat sink is then aligned and pressed onto the component (Steps 3&4). To ensure adhesion over the whole surface of the component, pressures applied to the heat sink area of 10 psi for 15 seconds or 30 psi for 5 seconds have been found to be effective. The process described thus far ensures reliable operation for periods of about a decade, but for longer life of 20 years required for industrial telecommunications equipment, at least one clip assembly is added. The spring clip assembly is located between the rows of pin-fins on the upper surface of the heat sink (Step 5). The spaces between the pin-fins are typically in excess of 65 mils and the spring diameter is typically 41 mils, so there is ample clearance. The edge of one end of the clip assembly is then inserted under a first side of the component and then the edge of the other end is inserted under a second side of the component (Steps 6&7). This is accomplished by pressing down upon the clip assembly. A small tool may be inserted into the aperture in the end to assist in attaching the spring clip assembly on crowded printed wiring boards. A second clip assembly may be applied in the same manner over and orthogonal to the first (Steps 8–10).

A fully assembled printed wiring board containing many components having hundreds of I/Os each is an expensive apparatus. Repairability is therefore an important economic issue and a method to remove a damaged component must be a factor in design.

Figure 5:
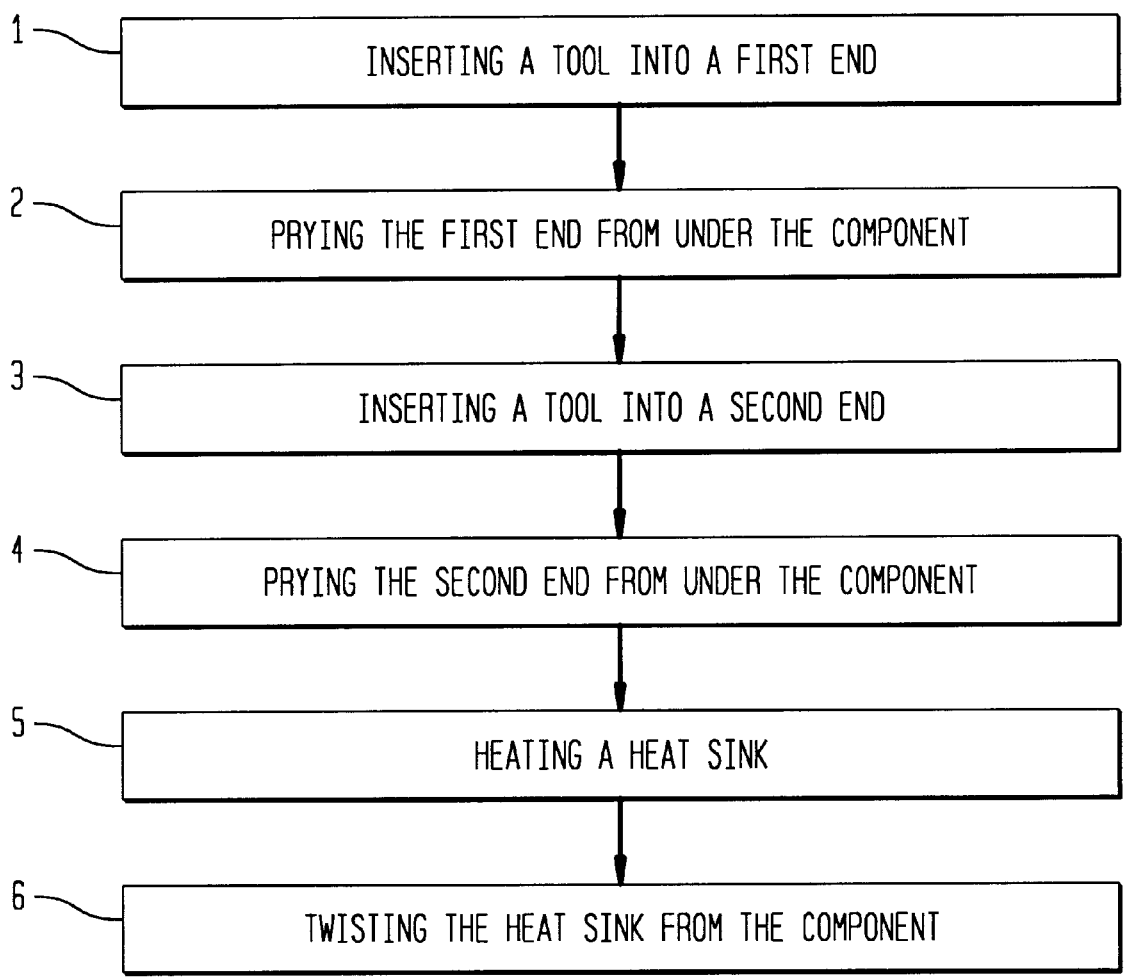

Referring now to FIG. 5, there is shown a method to remove the heatsink. A small tool such as a screw driver is inserted into the aperture in each end and the edge of each end is pried away from the bottom surface of the component (Steps 1–4). The process is repeated if two clip assemblies are in place. A thin blade is next inserted at the corner of the tape interface between the heat sink and the component to create a wedge. A thin spatula is next inserted into the wedge and it is slowly twisted to exert a force between the heat sink and the component (Step 6). The tape is allowed to yield to enlarge the wedge, and the process is continued until the wedge is large enough to advance the spatula until the heat sink is separated from the component. The heat sink may then be cleaned for reuse with new tape. The heat sink can also be removed by heating the component-heat sink assembly to about 100 degrees C. for 30 to 60 seconds with a hot air repair tool commonly used for circuit pack repair (Step 5). The heat sink can then be twisted off while wearing an insulated glove.

The advantages of the clip assembly are that thermal contact between the heat sink and component is ensured for periods and operating temperatures which would degrade ordinary adhesives. The design and mounting method are compatible with ball grid array components which are assembled with surface mount technology. The design and fabrication of the supporting printed wiring board is simplified because no mounting holes are required for a heat sink and more space is available for conductor wiring. The mounting of the heat sink allows the selection of components that operate at levels higher than four watts of power for a service life of 20 years.

Changes and modifications in the specifically described embodiments can be carried out without departing from the scope of the invention. In particular, the dimensions of the clip assembly maybe adjusted to fit a particular combination of component and heat sink, particularly to keep the dimensions of the edges within the edge clearance of the solder balls and the edge stand-off clearance between the component and the printed wiring board.

I claim:

1. A clip assembly for a heat sink comprising:
   a spring comprising,
   a distal section having two ends,
   two riser sections, each having two ends, the first end of each being connected to the ends of the distal section to form a first plane,
   two bent sections, each having two ends and a nadir, the first end of each being connected to the second ends of each riser section to form second planes normal to the first plane,
   two descending sections, each having two ends, the first end of each being connected to the second end of each bent section to lie in the second plane,
   two proximal sections, each having first and second ends, the first end of each being connected to the second end of each descending section, the proximal sections being in a plane parallel to the first plane, and
   two second riser sections, each having a first and second end, the first end of each being connected to the second end of each proximal section to form a plane parallel to the first plane; and
   two ends, each comprising an edge, the first end being connected to the distal section of the spring, the second end being connected to the proximal section of the spring;
   whereby the edge of each end is adapted to fit between an electronic component and a printed wiring board which supports it, and the nadir of the spring being adapted to exert a force against the heat sink biasing it against the electronic component.

2. The clip assembly of claim 1 wherein each end defines an aperture.

3. The clip assembly of claim 1 wherein each end further comprises at least one arbor adapted to be secured by the spring.

4. The clip assembly of claim 1 wherein each end further comprises at least one post adapted to be secured by the spring.

5. The clip assembly of claim 1 wherein the spring is adapted to fit between rows of fins emanating from a top surface of the heat sink base.

6. The assembly of claim 1, further comprising:
   a heat sink having an upper surface, a lower surface, and an array of fins emanating from the upper surface.

7. The assembly of claim 6 further comprising a thermally conducting layer adhering to the lower surface of the heat sink.

8. The assembly of claim 7 wherein the thermally conducting layer is in the form of a double sided tape.

9. A heat sink combination for an electronic component comprising:
   a heat sink having an upper surface, a lower surface, and an array of fins emanating from the upper surface;
   a clip assembly comprising,
   a distal section having two ends,
   two riser sections, each having two ends, the first end of each being connected to the ends of the distal section to form a first plane,
   two bent sections, each having two ends and a nadir, the first end of each being connected to the second ends of each riser section to form second planes normal to the first plane,
   two descending sections, each having two ends, the first end of each being connected to the second end of each bent section to lie in the second plane,
   two proximal sections, each having first and second ends, the first end of each being connected to the second end of each descending section, the proximal sections being in a plane parallel to the first plane, and
   two second riser sections, each having a first and second end, the first end of each being connected to the second end of each proximal section to form a plane parallel to the first plane; and
   two ends, each comprising an edge, the first end being connected to the distal section of the spring, the second end being connected to the proximal section of the spring, whereby the finger of each end is adapted to fit between an electronic component and a printed wiring board which supports it, and the nadir of the spring being adapted to exert a force against the heat sink biasing it against the electronic component; and a thermally conducting layer, adhering to the lower surface of the heat sink, adapted to contact an upper surface of the electronic component.

10. The clip assembly of claim 9 wherein each end defines an aperture.

11. The clip assembly of claim 9 wherein each end further comprises at least one arbor adapted to be secured by the spring.

12. The clip assembly of claim 9 wherein each end further comprises at least one post adapted to be secured by the spring.

13. The clip assembly of claim 9 wherein the spring is adapted to fit between rows of fins emanating from an upper surface of the heat sink.

14. The heat sink combination of claim 9 wherein the thermally conducting layer is in the form of a double sided tape.

15. The assembly of claim 1, further including a method of attaching a heat sink having fins and a thermally conducting layer to a ball grid array electronic component comprising:

cleaning an upper surface of the component with a solvent for removing organic contamination;

peeling a protective liner from the heat sink thermally conducting layer for exposing it;

positioning the heat sink over the component for aligning it;

pressing the heat sink onto the component for adhering the heat sink to the component;

locating the spring of a clip assembly between rows of fins on the heat sink for aligning the clip assembly;

inserting a first edge of the clip assembly under a first edge of the component; and inserting a second edge of the clip assembly under a second edge of the component.

16. The method of claim 15 wherein the cleaning comprises wiping with a solvent.

17. The method of claim 15 further comprising heating the surface of the component to a temperature exceeding 40 degrees C. for promoting adhesion.

18. The method of claim 15 further comprising:

locating the spring of a second clip assembly between rows of fins on the heat sink for aligning the clip assembly;

inserting a first edge of the second clip assembly under a first edge of the component; and inserting a second edge of the second clip assembly under a second edge of the component, wherein the second clip assembly is oriented perpendicular to the first clip assembly.

19. The assembly of claim 10, further including a method of removing a heat sink secured by a clip assembly from a ball grid array electronic component comprising:

inserting a tool into an aperture defined by a first end of the clip assembly;

prying the edge of the first end from under the component;

inserting a tool into an aperture defined by a second end of the clip assembly;

prying the edge of the second end from under the component;

heating the heat sink to a temperature exceeding 60 degrees C. for softening an adhesive layer securing the heat sink to the component; and twisting the heat sink away from the component.

* * * * *